(12) United States Patent
Bains et al.

(10) Patent No.: US 9,704,563 B2
(45) Date of Patent: Jul. 11, 2017

(54) APPARATUS, METHOD AND SYSTEM FOR PERFORMING SUCCESSIVE WRITES TO A BANK OF A DYNAMIC RANDOM ACCESS MEMORY

(71) Applicant: Intel Corporation, Santa Clara, CA (US)

(72) Inventors: Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/940,073

(22) Filed: Nov. 12, 2015

(65) Prior Publication Data

US 2016/0163376 A1    Jun. 9, 2016

Related U.S. Application Data

(60) Provisional application No. 62/089,185, filed on Dec. 8, 2014.

(51) Int. Cl.
*G11C 7/10*    (2006.01)
*G11C 11/4093*    (2006.01)
(Continued)

(52) U.S. Cl.
CPC ...... *G11C 11/4093* (2013.01); *G11C 11/4076* (2013.01); *G11C 11/4096* (2013.01); *G11C 29/52* (2013.01); *G11C 2029/0411* (2013.01)

(58) Field of Classification Search
CPC ......... G11C 16/10; G11C 7/10; G11C 7/1051; G11C 11/1675
See application file for complete search history.

(56) References Cited

U.S. PATENT DOCUMENTS 7,054,222 B2 *  5/2006  Li ................. G11C 7/1078
                                          365/189.16
9,195,530 B1 * 11/2015  Jean ............. G06F 13/4027
(Continued)

OTHER PUBLICATIONS

Non Final Office Action and Search Report from Taiwan Application No. 104140941 mailed Feb. 17, 2017, 14 pgs.

*Primary Examiner* — Son Dinh
*Assistant Examiner* — Uyen B Tran
(74) *Attorney, Agent, or Firm* — Blakely, Sokoloff, Taylor & Zafman LLP

(57) ABSTRACT

Techniques and mechanisms to provide write access to a memory device. In an embodiment, a memory controller sends commands to a memory device which comprises multiple memory banks. The memory controller further sends a signal specifying that the commands include back-to-back write commands each to access the same memory bank. In response to the signal, the memory device buffers first data of a first write command, wherein the first data is buffered at least until the memory device receives second data of a second write command. Error correction information is calculated for a combination of the first data and second data, and the combination is written to the memory bank. In another embodiment, buffering of the first data and combining of the first data with the second data is performed, based on the signal from the memory controller, in lieu of read-modify-write processing of the first data.

19 Claims, 6 Drawing Sheets

(51) Int. Cl.
*G11C 11/4076* (2006.01)
*G11C 11/4096* (2006.01)
*G11C 29/52* (2006.01)
*G11C 29/04* (2006.01)

(56) References Cited

U.S. PATENT DOCUMENTS

| | | | | |
|---|---|---|---|---|
| 2003/0093744 A1* | 5/2003 | Leung | ......... | G06F 11/1048 |
| | | | | 714/763 |
| 2011/0055457 A1* | 3/2011 | Yeh | ......... | G06F 3/0611 |
| | | | | 711/103 |
| 2013/0013853 A1* | 1/2013 | Yeh | ......... | G06F 12/0246 |
| | | | | 711/103 |
| 2014/0372833 A1* | 12/2014 | Liang | ......... | G06F 11/1068 |
| | | | | 714/773 |

\* cited by examiner

| Command 402 | Next Command 404 | | Units |
|---|---|---|---|
| | Write | Mask Write | |
| Write | tCCD_L_WR | tCCD_L_WR | tCK |
| Mask Write | tCCD_L_WR | tCCD_L_WR | |

400

| | DDR4 1600 | DDR4 1866 | DDR4 2133 | DDR4 2400 | DDR4 2667 | DDR4 3200 |
|---|---|---|---|---|---|---|
| CWL | 9 | 10 | 11 | 12 | 14 | 16 |
| BL8/BC4 | 4 | 4 | 4 | 4 | 4 | 4 |
| tWTR_L | 6 | 7 | 8 | 9 | 11 | 12 |
| tCCD_L_WR | 19 | 21 | 23 | 25 | 29 | 32 |

410

| Command 422 | Next Command 424 | | Units |
|---|---|---|---|
| | Write | Mask Write | |
| Write | tCCD_L | tCCD_L_WR | tCK |
| Mask Write | tCCD_L_WR | tCCD_L_WR | |

APPARATUS, METHOD AND SYSTEM FOR PERFORMING SUCCESSIVE WRITES TO A BANK OF A DYNAMIC RANDOM ACCESS MEMORY

RELATED APPLICATIONS

This application is a nonprovisional application based on U.S. Provisional Patent Application No. 62/089,185 filed Dec. 8, 2014, and claims the benefit of priority of that provisional application. Provisional Application No. 62/089,185 is hereby incorporated by reference.

BACKGROUND

1. Technical Field

Embodiments of the invention generally relate to the field of integrated circuits and more particularly, but not exclusively, to write operations performed at a dynamic random access memory device.

2. Background Art

Modern Dynamic Random Access Memory (DRAM) designs are facing process yield issues that require internal error correction mechanisms such as Error Correction Code(s) (ECC). Current solutions for DRAM devices, such as a Joint Electron Device Engineering Council (JEDEC) Wide input-output 2 (WIO2) compliant DRAM device and a JEDEC Low Power Dual Data Rate 4 (LPDDR4) compliant DRAM device, internally perform single error correction (SEC) using 136/128 Hamming codes, where 8 dedicated bits per 128 data bits are used for coding. External data transfer size and internal prefetch size are both 128-bits in the cases of WIO2 and LPDDR4 compliant DRAM devices.

BRIEF DESCRIPTION OF THE DRAWINGS

The various embodiments of the present invention are illustrated by way of example, and not by way of limitation, in the figures of the accompanying drawings and in which:

FIG. 4 show tables of timing parameter information for operation of a memory device according to an embodiment.

DETAILED DESCRIPTION

Figure 1:
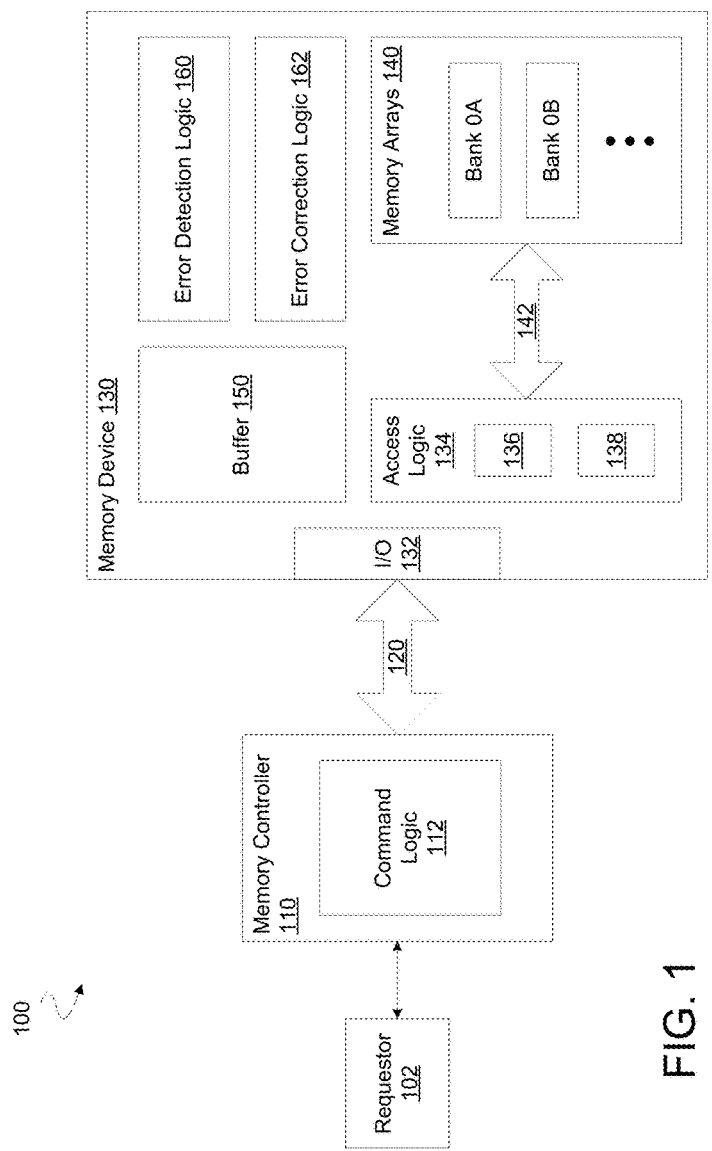
FIG. 1 is a block diagram illustrating elements of a system for providing access to a memory according to an embodiment.

Embodiments discussed herein variously provide techniques or mechanisms for performing successive writes to a bank of a memory device. The memory device may include a multiple banks of memory cells and error detection logic which, for example, includes or couples to error correction logic of the memory device. The error detection logic may detect for errors of data stored by the memory banks—e.g. where an integrated circuit die (for brevity, referred to herein as a 'die') containing the memory device includes both the memory banks and the error detection circuitry.

Dynamic random access memory (DRAM) devices, such as those conforming to various dual data rate (DDR) standards, are beginning to incorporate local error check and error correction functionality. In the case of devices that conform to a DDR4 standard, e.g., that of the DDR4 SDRAM Specification (Document JESD79-4) released September 2012 by the Joint Electron Devices Engineering Council (JEDEC) Solid State Technology Association, external data transfer size is 32 bits for x4 device and 64 bits for x8 device. In order to minimize the die size impact of the error check/correction, JESD79-4 allows internal prefetches to be 64 bits or 128 bits in size. The difference in sizes between internal pre-fetches and external data transfers results in loss of performance for back-to-back write accesses to the same memory bank resource.

Various embodiments facilitate efficient streaming (sequential writing) of data to the same memory bank resource. Such streaming may mitigate performance degradation due to latency that might otherwise occur, for example, by performance of internal "read-modify-write" operations by the memory device. For example, some embodiments may selectively avail of buffering at the memory device based, at least in part, on a comparison of a size of internal pre-fetch and a size of an external data transfer. A memory device according to one embodiment buffers first data received by the memory device in a write data transfer, e.g., a transfer of data from the memory controller for writing to the memory. The first data may be buffered at least until the memory device receives second data from a next write data transfer from the memory device. The buffering may be in response to the memory controller signaling to the memory device that sequential writes are to target the same memory bank of the memory device. Such signaling may be based on the memory controller determining that a single error correction value is based on (or is to be based on) each of multiple chunks of data, and that multiple back-to-back write data transfers are to write a different respective one of the multiple chunks of data.

If the internal prefetch size is larger than the external data transfer size, then the DRAM (or other memory device) may perform an internal read-modify-write operation, in which already-stored data is read from a memory location that is targeted by a write command. The DRAM may correct any single bit errors as a result of the internal read before merging the incoming write data (e.g., incoming from a memory controller or processor) and may then compute an ECC for the merged data before writing the merged data and the corresponding ECC bits to the memory array.

In some embodiments, if the DRAM detects a double bit error on the data read from internal read, then the DRAM may not correct this read data. In such a case, the DRAM may simply merge the incoming data and then compute the ECC before writing the data and the ECC bits to the memory array. On read operations, the DRAM may correct any single bit errors before returning the data to the memory controller. The DRAM may also detect for a double bit error on the read data, and (in some embodiments) return the data without any correction of any such double bit error.

The technologies described herein may be implemented in one or more electronic devices. Non-limiting examples of electronic devices that may utilize the technologies described herein include any of various types of mobile devices and/or stationary devices, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, wearable electronics, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of various electronic devices configured to perform sequential writes to a bank (or bank group) of a memory device.

FIG. 1 illustrates elements of a system 100 to provide write access to memory resources according to an embodiment. System 100 represents any of a number of computing systems (or a sub-system thereof) that may include memory which supports sequential (also referred to herein as "back-to-back") write accesses to a bank of memory cells. Such computing systems may include servers, desktops, laptops, mobile devices, smartphones, gaming devices, and others.

System 100 may include a memory device 130 coupled to a memory controller 110 via an interconnect 120, for example where memory controller 110 is to control, at least in part, a transfer of information between a requester 102 and memory device 130. Some embodiments may be variously provided merely by memory device 130, merely by memory controller 110, or by a system including both memory device 130 and memory controller 110. Requester 102 may be a processor (e.g., a central processing unit and/or one or more cores) an input/output device (e.g., a peripheral component interconnect (PCI) Express device), another memory device, or any other element of system 100 that requests access to memory 130. In some embodiments, memory controller 110 is on the same die as requester 102.

Memory device 130 may include any of a variety of types of memory technologies that, for example, have rows of memory cells, where data is accessible via a wordline or the equivalent. In one embodiment, memory device 130 includes dynamic random access memory (DRAM) technology such as that which operates according to a Dual Data Rate (DDR) specification, such as the DDR4 SDRAM Standard (as Document JESD79-4) released September 2012 by the Joint Electron Devices Engineering Council (JEDEC) Solid State Technology Association (or other such memory standard). Memory device 130 may be an integrated circuit package within a larger memory device (not shown) of system 100. For example, memory device 130 may be a DRAM device of a memory module such as a dual in-line memory module (DIMM). Descriptions herein referring to a "DRAM" will be understood to apply to any memory device that allows random access. The memory device or DRAM can refer to the die itself and/or to a packaged memory product. The DRAMs include multiple banks that can be managed as separate bank groups.

References to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory device 130 may include memory arrays 140, which represent one or more logical and/or physical groups of memory. An example of one such grouping of memory is a bank of memory resources which, for example, may include an array of storage elements arranged in rows and columns. By way of illustration and not limitation, portions of memory arrays 140 may include (e.g. be configured to operate as) one or more banks, as represented by the illustrative banks 0A, 0B.

Memory device 130 may include access logic 134 to facilitate, at least in part, access to memory arrays 140—e.g. where such access is provided for servicing one or more commands from memory controller 110. Access logic 134 may include, or operate in conjunction with, logic of memory device 130 which (for example) provides resource access at least in part according to conventional techniques. By way of illustration and not limitation, access logic 134 may include or couple to column logic and/or row logic (not shown) which are used to decode an access instruction to the proper memory location within memory arrays 140.

In an embodiment, memory controller 110 may send commands or instructions to memory device 130 over one or more buses, as represented by the illustrative interconnect 120 coupling I/O circuitry 132 of memory device 130 to memory controller 110 and/or one or more other memory devices (not shown). Such commands may be interpreted by memory device 130 using for example, access logic 134 to decode command information to perform a variety of access functions within the memory and/or decoding address information with column logic and/or row logic. For example, such logic may access a specific location in memory arrays 140 with a combination of a column address strobe or signal (CAS) and a row address strobe or signal (RAS). Rows of memory may be implemented in accordance with known memory architectures or their derivatives. Briefly, a row of memory arrays 140 may include one or more addressable columns of memory cells, as identified by the CAS generated by column logic of memory device 130. The rows may each be variously addressable via the RAS generated by row logic of memory device 130. Access to memory arrays 140 may be for the purpose of writing data exchanged (and/or reading data to be exchanged) via a data bus which, for example, is included in interconnect 120.

Memory device 130 may store data bits and, in an embodiment, further store corresponding error check bits, e.g., error correction code (ECC) bits, for such data bits in memory arrays 140. Memory device 130 may also include on-die error detection logic 160. In some embodiments, circuitry of error detection logic 160 enhances the reliability, availability, and serviceability (RAS) of memory device 130. More particularly, in some embodiments, error detection logic 160 enables memory device 130 to identify whether one or more of data bits have been corrupted based on corresponding error check bits which, for example, may also be stored in memory device 130. In some embodiments, error detection logic 160 includes, for example, ECC computation logic and comparison logic. This computation and comparison logic may enable memory device 130 to locally compute ECC bits for data, e.g. during a read of such data, and to compare the locally computed ECC bits with stored ECC bits. If the locally computed ECC bits do not match the stored ECC bits, then error detection logic 160 may signal error correction logic 162 of memory device 130 to correct at least some types of data errors (e.g., including single bit errors). In an embodiment, at least some data errors that comprise multiple bits are not corrected by error correction logic 162.

Memory controller 110 may include command logic 112—e.g. including any of a variety of hardware logic and/or executing software logic—to send commands via interconnect 120. Command logic 112 may perform, facilitate and/or supplement operations to generate, transmit or otherwise determine commands which are sent according to one or more conventional techniques. By way of illustration and not limitation, command logic 112 may provide (and in some embodiments, supplement) otherwise conventional command/address signaling functionality which, for example, conforms to some or all requirements of a DDR4 specification, and/or other specifications. Over a period of time during operation of system 100, command logic 112 may variously send commands each to write to the memory arrays 140. Such commands may include two or more write commands each targeting the same bank of memory arrays 140. For example, the two or more commands may be sent in a sequence that does not include any write command targeting another bank (and that, in some embodiments, does not include any read command, for example). For brevity, such a sequence of commands targeting the same memory bank are referred to herein as "back-to-back" (or "sequential") commands.

In some embodiments, a memory device buffers data received via one external data transfer, e.g., a transfer of data to the memory device from the memory controller, for later processing of such data together with other data from one or more subsequent (back-to-back) external data transfers. Such buffering may take place in lieu of the memory device performing read-modify-write processing of data from only one external data transfer. For example, the buffering may be based on the memory controller signaling to the memory device that multiple successive data transfers are to target the same memory bank. Such a signal may, in turn, be based on the memory controller determining that the multiple successive data transfers are each to retrieve a respective one of multiple chunks of data, and that one error correction value, e.g., an ECC value, is based on a combination of each of the multiple chunks of data. Commonality of such multiple chunks to one error correction value may allow for an efficiency wherein one calculation (e.g., a recalculation) of the error correction value takes place—rather than multiple recalculations—during sequential writes each for a different respective one of the multiple chunks.

A manner in which memory device 100 is to service a particular plurality of back-to-back read commands may depend at least in part upon a configuration of system 100. By way of illustration and not limitation, memory device 130 may include a buffer 150 to variously store at least some data prior to such data being committed to memory arrays 140. In such an embodiment, a configuration of memory device 130, e.g., relative to other components of system 100, may determine how data is to be stored to buffer 150 (e.g., whether and/or how long such buffering of the data is to take place) in the course of servicing of back-to-back read commands.

In some embodiments, memory controller 110 and memory device 130 are configured to support data transfers via interconnect 120 that are each in data portions of a particular first size. In the illustrative example of DDR4 memory devices, an external data transfer size is 32 bits for x4 devices (including four DQ data pads) and 64 bits for x8 devices (including eight DQ data pads). Memory device 130 may be configured to perform pre-fetch operations, where each such pre-fetch is to retrieve from memory arrays 140, via a bus 142, data in portions that are of a particular second size. The relationship of the first size to the second size may determine at least in part whether (or not) and/or how data is to be stored at buffer 150.

For example, access logic 134 may include or couple to pre-fetch logic 136 comprising circuitry to variously perform pre-fetches to read data from memory arrays 140 via bus 142. Access logic 134 may further include or couple to detector logic 138 including circuitry to detect for one or more test conditions indicating, for example, whether pre-fetch logic 136 is to perform a pre-fetch and/or whether any pre-fetched data is to be written to buffer 150. Based on an evaluation of the one or more test conditions, detector logic 138 may detect that a particular type of current or expected back-to-back reads are indicated and (in some embodiments) that a particular type of servicing of such back-to-back reads, e.g., one of multiple different possible types of servicing, is indicated. In response, detector logic 138 may variously initiate such servicing by signal one or more components of memory device 130, e.g., including some or all of pre-fetch logic 136, buffer 150, error detection logic 160, error correction logic 162 and/or the like.

Figure 2:
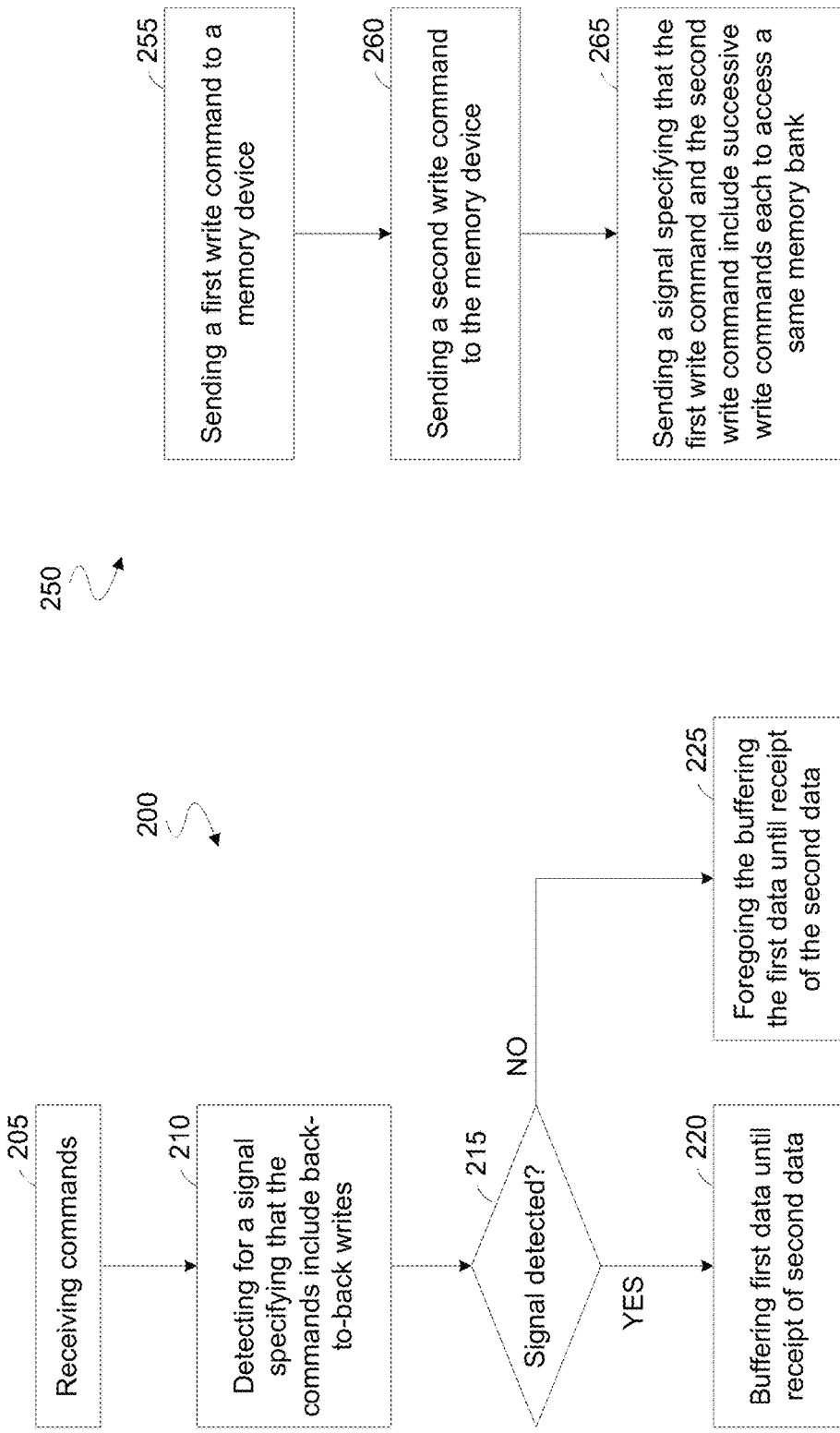
FIG. 2A is a flow diagram illustrating elements of a method for operating a memory device according to an embodiment.
FIG. 2B is a flow diagram illustrating elements of a method for operating a memory controller according to an embodiment.

FIG. 2A illustrates a flow diagram for a method 200 of servicing write requests with a memory device, according to an embodiment. Method 200 may include operations, performed at a memory device (such as memory device 130), to facilitate access to one or more memory arrays of the memory device. Such access may include, for example, streaming data to a single memory bank. It is pointed out that although flow diagrams for methods described herein include respective blocks that are shown in a particular order, the order of the corresponding operations may be modified. Thus, the illustrated embodiments may be performed in a different order, and some actions/blocks may be performed in parallel. Some of the blocks and/or operations shown in the figures are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 200 may include, at 205, receiving commands from the host (e.g., a memory controller) that is coupled to the memory device. The commands may include a first command and a second command to write first data and second data, respectively, to the same memory bank (or alternatively, to different memory banks) of a plurality of memory banks of the memory device.

At 210, method 200 may detect for a signal, from the host, which specifies that the commands include successive write commands each to access a same memory bank of the memory device. The signal may be communicated in one of the commands received at 205, prior to some or all such commands or after some or all such commands, according to different embodiments. In an embodiment, the signal is provide to the memory device independent of, e.g., prior to and/or in addition to, address information of the commands. For example, the signal may be distinguished from address information that is sufficient to identify addressable locations of the memory device, the addressable locations variously targeted by the commands.

If it is determined, at 215, that the signal is detected, then, at 220, method 200 may buffer the first data, at a buffer of the memory device, at least until a receipt of the second data of the commands. For example, the first data may be buffered to facilitate a later appending (or other combining) of the first data and second data with each other. In an embodiment, method 200 further performs calculating of error check information based on the first write data and the second write data. For example, an ECC value of other error check value may be calculated based on a combination of the first data and second data. After combining of the first data and second data, the combined data and the calculated error check information may be stored to the memory banks, e.g., to the same memory bank.

In some embodiment, respective data from multiple back-to-back write commands is successively buffered until a receipt of data from a last of the back-to-back write commands. For example, based on the signal detected at 215 (and in some embodiment, further based on one or more other signals each indicating more of the back-to-back write commands), the buffer of the memory device may store the second data, concurrently with the first data, until a receipt of third data of the successive write commands. Back-to-back write commands can include more than two sequential write commands.

The buffering at 220 may be conditioned at least upon the signal being detected at 215. For example, if a failure to detect the signal is identified at 215, then, at 225, method 200 may forego the buffering at 225. In an embodiment, foregoing buffering the first data 225 may include performing a different buffering, or no buffering, of the first data, e.g., where a duration of buffering, a location of buffering, a type of debuffering and/or the like is different than might otherwise be provided if the signal was instead detected at 215. In such an embodiment, the memory device may instead perform read-modify-write operations each to store a respective one of the first data and the second data.

FIG. 2B illustrates a flow diagram for a method 250 of controlling a memory device, according to an embodiment. Method 200 may include operations performed at memory controller 110 or other such host for a memory device. In an embodiment, method 250 includes operations to send multiple commands from the memory controller to a memory device that comprises a plurality of memory banks. For example, such operations may include, at 255, sending a first write command to the memory device and, at 260, sending a second write command to the memory device.

In an embodiment, method 250 further comprises, at 265, sending a signal to specify to the memory device that the multiple commands include successive write commands—e.g., including the first write command and the second write command—that are each to access a same memory bank of the plurality of memory banks. The sending at 265 may be based on the memory controller detecting that a single error correction value (e.g., an ECC value) is based on—or is to be based on—both first data of the first write command and second data of the second write command. The signal sent at 265 may be, for example, the signal that is detected for at operation 210 of method 200. In response to the signal sent at 265, the memory device may store the first data of the successive write commands to a buffer of the memory device. The first data may be thus buffered until the receipt of second data of the successive write commands. In an embodiment, the memory device further calculates error check information based on the first write data and the second write data. More than two successive write commands can be buffered so that the memory device further calculates error check information based on the more than two successive write commands.

Figure 3:
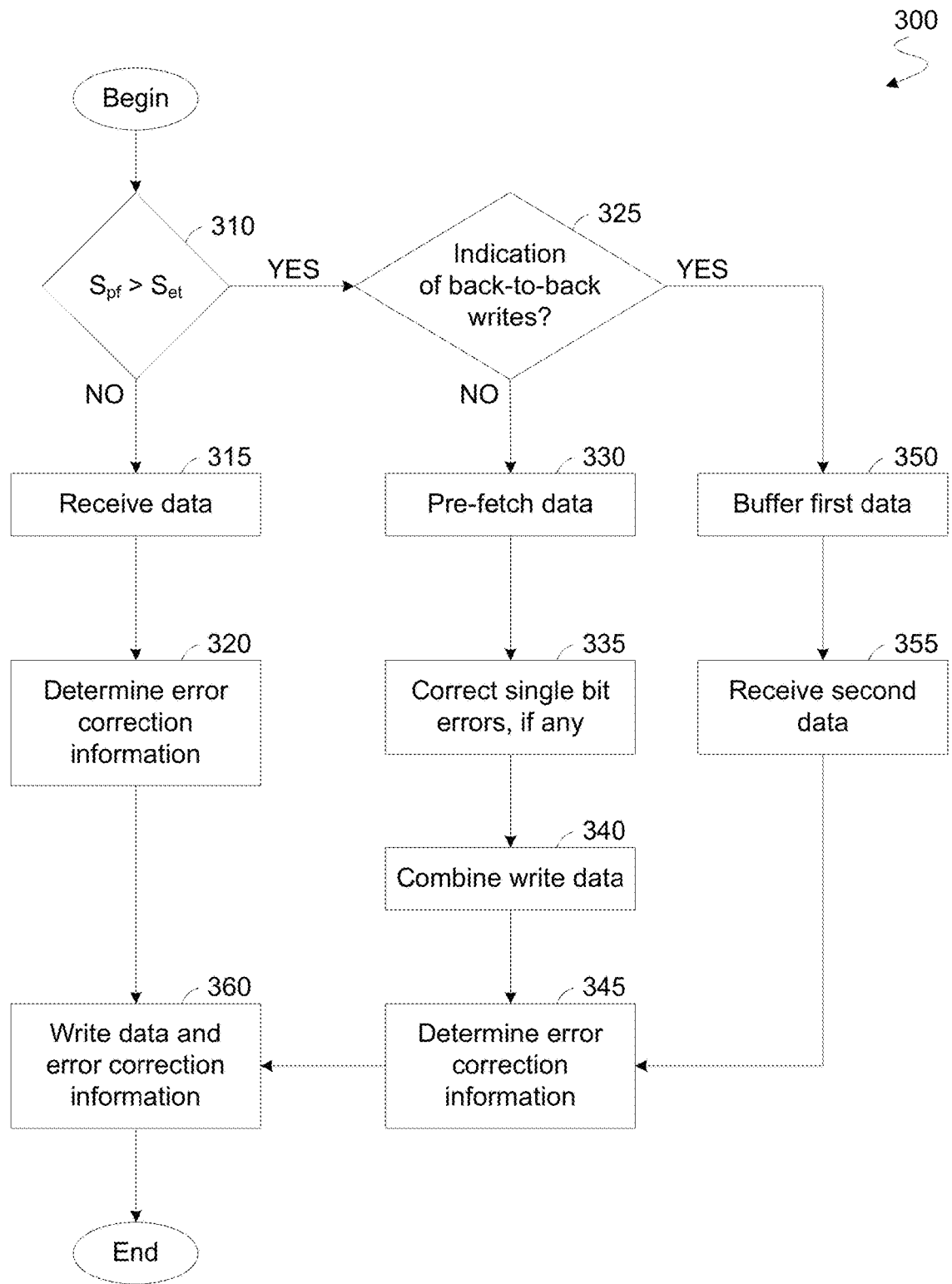
FIG. 3 is a flow diagram illustrating elements of a method for operating a memory device according to an embodiment.

FIG. 3 illustrates a flow diagram for a method 300 of servicing write requests with a memory device, according to an embodiment. Method 300 may include operations to access one or more memory arrays of memory device 130. Such access may include, for example, streaming data to a single memory bank. It is pointed out that although the blocks in the flow diagram for method 300 are shown in a particular order, the order of the actions may be modified.

Method 300 may include, at 310, determining whether a size $S_{pf}$ of an individual pre-fetch (e.g., a minimum pre-fetch size) in the memory device is larger than a Set of an individual data transfer (e.g., a minimum external data transfer size) between the memory device and a memory controller. The determining at 310 may include detector logic 138 (or other circuitry of memory device 130) accessing one or more mode registers defining configuration state of system 100. Such determining at 310 may include, for example, comparing a bandwidth of bus 142 to a data bandwidth of interconnect 120.

Where it is determined at 310 that $S_{pf}$ is less than (or, in some embodiments, equal to) Set, method 300 may, at 315, receive data that is to be written to the memory device. In some embodiments, a receiving of data, such as that at 315, is performed prior to the determining at 310. Method 300 may further perform processing at 320 that, for example, determines error correction information, such as an error correction code (ECC), for the data received at 315. After error correction information is calculated at 320, method 300 may write the data and error correction information to the memory device, at 360.

Where it is instead determined at 310 that $S_{pf}$ is greater than Set, method 300 may detect, at 325, for an indication that back-to-back (sequential) writes to the same memory bank are to take place. The indication to be detected for at 325 may include, for example, a pre-defined command, parameter or other communication sent from the memory controller, e.g., wherein the communication is to explicitly invoke a buffering functionality of the memory device. The memory controller may indicate, e.g., prior to or concurrently with the sending of first data (associated with one of back-to-back write commands), that such first data is to be buffered at least until the receipt by the memory device of second data (associated with a second one of the back-to-back write commands).

Accordingly, where the indication of back-to-back writes is detected at 325, method 300 may buffer such first data at 350, and subsequently receive such second data at 355. Method 300 may further perform processing at 345 that determines an ECC or other such error correction information for the first data and the second data. The determining at 345 may include calculating respective ECC values for each of the first data and the second data or, alternatively, calculating an ECC value for a combination of the first data and the second data. After the error correction information is calculated at 345, method 300 may, at 360, write the first data, second data and the corresponding error correction information to the memory device.

However, where method 300 instead fails to detect the indication of back-to-back writes at 325, read-modify-write operations may be performed. For example, such read-modify-write operations may include, at 330, pre-fetching data that is already stored at a memory bank that is targeted by a write request. The pre-fetching at 330 may also include retrieving previously-determined error correction information that corresponds to the pre-fetched data. At 335, the pre-fetched data may be processed to correct at least any single bit (that is, merely single bit) errors that may exist. In some embodiments, method 300 foregoes correcting any multiple-bit data errors that may be detected. After processing to correct any single bit errors, the pre-fetched data may be combined, at 340, with write data provided by the memory controller as a payload of a write request.

Method 300 may further perform processing at 345 that determines an ECC or other such error correction information for the resulting combination of the pre-fetched data and the received write data. The determining at 345 may include calculating a single ECC (or other) value for the entire combination of data or, alternatively, multiple ECC values each for a respective portion of the combination. After such error correction information is calculated at 345, method 300 may, at 360, write the combination of data and the corresponding error correction information to the memory device.

In some embodiments, the indication that is detected for at 320 is indicative of only some (but not all) types of back-to-back write operations. For example, a memory controller may actually perform successive back-to-back writes to a particular bank of a memory device. However, the memory controller may selectively forego use of a buffer functionality that is otherwise available at the memory device to aid in other back-to-back writes.

FIG. 4 shows a table 400 representing timing constraints for a memory device according to an embodiment. The timing constraints shown in table 400 pertain to the processing of commands that a memory device receives from a memory controller. Table 400 may describe constraints imposed on memory device 130 and/or imposed on the performance of method 300, for example.

Table 400 includes a column-wise representation for a given command 402 and a row-wise representation for a next command 404 that is to follow that given command 402. The commands represented in table 400 include a Write command and a Mask Write command. Each combination of a command 402 and a next command 404 corresponds to a respective minimum command-to-command delay time (tCCD) required between such commands.

Table 400 shows one example of tCCD constraints for an x4 DRAM device having an I/O width of the DDR interface complaint device. The timing constraints shown in table 400 may apply for back-to-back commands to access the same bank group of such an x4 DRAM device, e.g., where the DRAM device includes internal ECC logic. An internal prefetch for an x4/x8 DRAM die may be 64 bits, in a typical example embodiment. As shown in table 400, a long write delay tCCD_L_WR may be required between Write commands, between Write Mask commands and/or between a Write command and a Write Mask command.

FIG. 4 also shows a table 410 representing, for various data rates of DDR4, respective values for tCCD_L_WR, as well as for a command address strobe write latency (CWL) timing parameter, a burst length (BL) timing parameter, and a time from write to read long (tWTR_L) timing parameter. The value of tCCD_L_WR, represented in tCK units (i.e., clock cycle time units), is defined as a sum of CWL, BL and tWTR_L. The value of tCK may depend upon a particular clock rate provided by the memory device, e.g., where DDR4 1600 provides a 800 MHz clock, DDR4 3200 a 16 MHz clock, and so forth.

FIG. 4 further shows a table 420 representing timing constraints for a memory device according to an embodiment. Table 420 may describe constraints imposed on memory device 130 and/or imposed on the performance of method 300, for example. Table 420 shows tCCD timing constraints for an x8 or an x16 DRAM device. In an embodiment, an x8 or an x16 device may, in some conditions, use the tCCD_L (tCCD long) value of a DDR4 specification for back-to-back writes to same bank group. Such conditions may include disabling of a DM (data mask) and setting of burst length 8 (BL8) mode. DM disabling may be provided, for example, by setting A10=0 in Mode Register 5 (MR5) according to a DDR4 specification. However, if DM is not disabled, or if Burst Chop 4 mode is used, then tCCDL_WR constraints, rather than tCCD_L constraints, will apply. In such a situation, table 400 may define timing constraints for some operations of a memory device—e.g., rather than table 420.

Referring again to the illustrative embodiment in FIG. 1, system 100 may illustrate one example of a high level memory architecture, with ECC-based DRAMs, to exchange a command according to an embodiment for indicating sequential writes. For an x4 device, internal prefetch size (e.g., via bus 142) may be larger than the external data transfer size (via interconnect 120). For example, the internal prefetch may be 64 bits, even though x4 may be a 32-bit prefetch architecture device. Embodiments described herein may variously operate with an internal prefetch size being 64 bits and an external data transfer size of 32 bits. However, such embodiments can be extended to any of a variety of other prefetch sizes that, for example, are an integer multiple larger than the external data transfer size.

In an illustrative scenario according to one embodiment, a memory device receives from a memory controller via a command address bus command address (CA) information of a write request, where the format of the CA information is compatible, for example, with a DDR4 standard. In this scenario, three bits CA[0:2] of the CA information format may be dedicated to burst sequence information, where six bits CA[3:8] are to provide address information, and another bit CA[9] is used to communicate which of two chunks (upper or lower) are being exchanged. For example, CA9 may be used to indicate that data to be exchanged (or being exchanged) is a particular half of data stored at an address communicated via CA[3:8]. In such an embodiment, the memory controller may monitor to detect for instances of data writes associated with the same CA[3:8] address bits, and different respective values (0 and 1) for the CA[9] bit. In response to detecting such a sequence, the memory controller may indicate to the memory device that such data writes may are being performed sequentially, where the memory device may buffer some of the data rather than perform successive read-modify-write operations. For example, the memory controller may determine based on CA[0:9] information that a single ECC value, or another such error correction value, is based on (or is to be based on) each of multiple chunks of write data, the multiple chunks each corresponding to a different respective one of sequential writes. Buffering may be performed once or multiple times in succession—e.g., in response to the CA[9] bits of successive write requests each indicating that a respective next write request is part of the sequence of back-to-back writes.

Some embodiments variously adapt, extend or otherwise modify conventional DDR command protocols to indicate that back-to-back writes—and associated buffering—are being (or are to be) performed. For example, an otherwise conventional WRITE CAS (Command Address Strobe)

command may be sent using one or more buses—e.g., including a command-address bus—from a host to a memory device. The memory device may be configured to access address bits to determine an address targeted by the WRITE CAS command, where an address bit that is extraneous for such a command, e.g. address bit A13, is adapted to indicate back-to-back data writes. The WRITE CAS command may be a first write request of such back-to-back data writes, for example. In one illustrative embodiment, respective logic of the host and memory device may be preconfigured to associate one address bit value (e.g., A13 is set to 1) with an instance of back-to-back data writes. Another value of the same address bit (e.g., A13 is set to 0) may be associated with a write that is not necessarily going to be one of back-to-back data writes—e.g., where the write that is to be performed without buffering that is otherwise efficient for back-to-back data writes. Buffering may be performed once or multiple times in succession—e.g., in response to the A[13] bits of successive write requests each indicating that a respective next write request is part of the sequence of back-to-back writes.

Indicating back-to-back data writes in this manner may signal to a memory device that data provided by the memory controller is to be buffered (e.g. rather than committed to a memory bank) at least until additional data is received from the memory controller. In one illustrative embodiment, a DRAM may keep 32 bits of first write data in a buffer when WRITE CAS is issued with A13=1. On a next data write to the same bank/bank group (e.g., bank 0), the DRAM (or DIMM comprising multiple DRAM dies) may receive an additional 32 bits of second write data. The DRAM may then compute an ECC on a resulting 64-bit chunk (i.e., a combination of the first write data and the second write data) before writing to the 64-bit chunk and the corresponding ECC to a DRAM memory core (e.g., bank 0A). In an embodiment where the memory device has a 128-bit internal bus, up to four 32-bit chunks may be combined together (e.g., based on buffering of at least the first three 32-bit chunks) before being written to the memory core.

One technical effect of various embodiments is an improvement in write operation performance. For example, tCCD (command-to-command timing) is typically set equal to a burst length for DRAM devices with a discrete bank architecture. For DRAMs configured in a bank group architecture, tCCD may be a couple of clocks longer than the burst length. In some embodiments, when the DRAM has to perform multiple "read modify write" operations—e.g., up to four 32-bit writes, each via a 128-bit internal bus of the memory device—the time needed for all of the writes can include at least multiples of tCCD. In this case, embodiments may variously provide a comparative performance gain of at least a delta between tCCD and tCCD_L_WR. In the case of 128-bit internal prefetches and 32-bit external data transfers, various embodiments can be extended to up to four (4) sequential writes, resulting in large performance gains.

Figure 5:
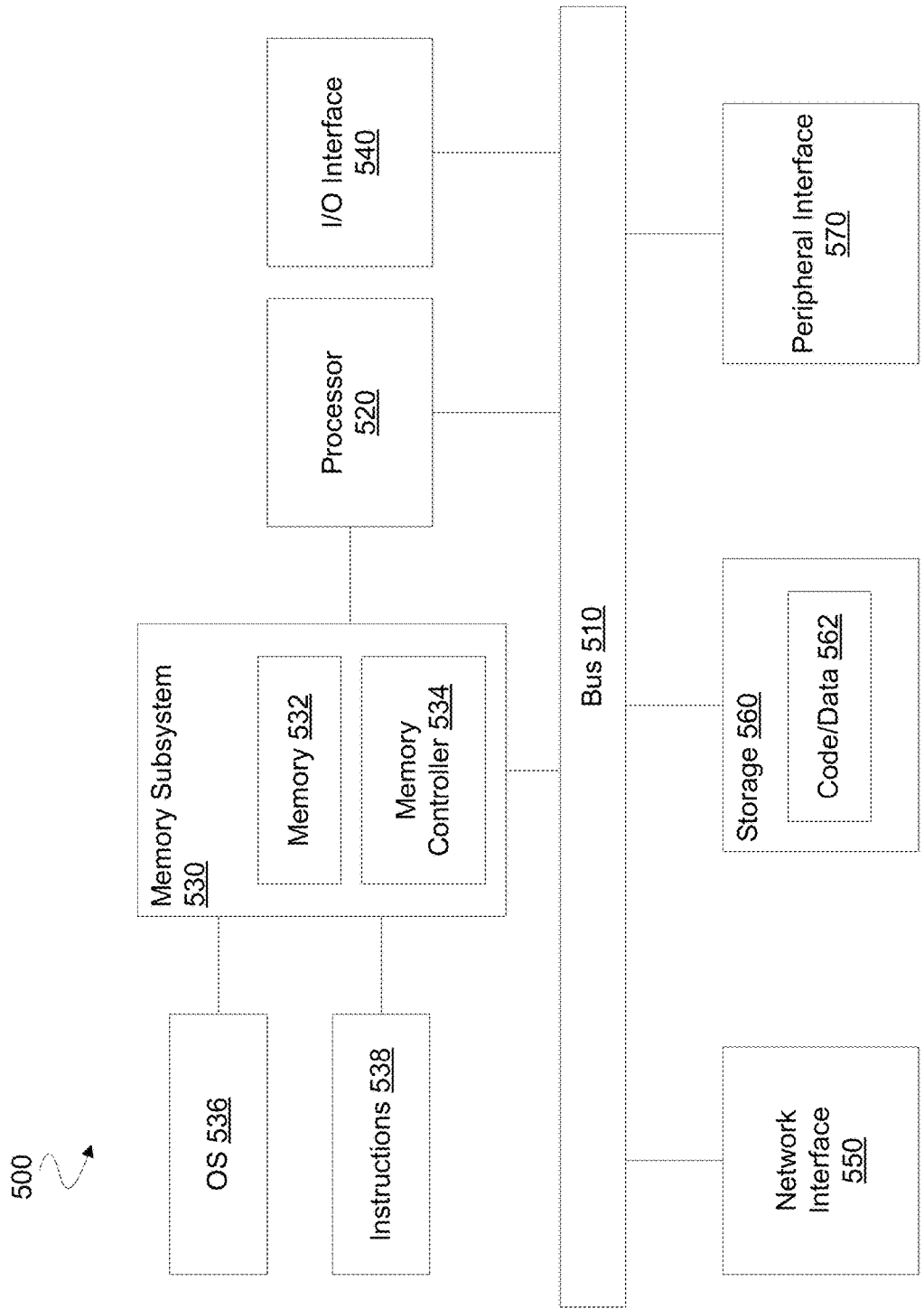
FIG. 5 is a block diagram illustrating elements of a computing system for providing access to memory resources according to an embodiment.

FIG. 5 is a block diagram of an embodiment of a computing system in which writes to a memory device may be implemented. System 500 represents a computing device in accordance with any embodiment described herein, and may be a laptop computer, a desktop computer, a server, a gaming or entertainment control system, a scanner, copier, printer, or other electronic device. System 500 may include processor 520, which provides processing, operation management, and execution of instructions for system 500. Processor 520 may include any type of microprocessor, central processing unit (CPU), processing core, or other processing hardware to provide processing for system 500. Processor 520 controls the overall operation of system 500, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 may include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 may include memory device 532 where it stores data, instructions, programs, or other items. In one embodiment, memory subsystem includes memory controller 534 to provide commands to memory device 532. Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 may also correspond to interfaces in network interface 550.

System 500 may also include one or more input/output (I/O) interface(s) 540, network interface 550, one or more internal mass storage device(s) 560, and peripheral interface 570 coupled to bus 510. I/O interface 540 may include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 may include an Ethernet adapter, wireless interconnection components, USB (universal serial bus), or other wired or wireless standards-based or proprietary interfaces.

Storage 560 may be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 may be generically considered to be a "memory," although memory 530 is the executing or operating memory to provide instructions to processor 520. Whereas storage 560 is nonvolatile, memory 530 may include volatile memory (i.e., the value or state of the data is indeterminate if power is interrupted to system 500).

Peripheral interface 570 may include any hardware interface not specifically mentioned above. Peripherals refer generally to devices that connect dependently to system 500.

A dependent connection is one where system 500 provides the software and/or hardware platform on which operation executes, and with which a user interacts.

Figure 6:
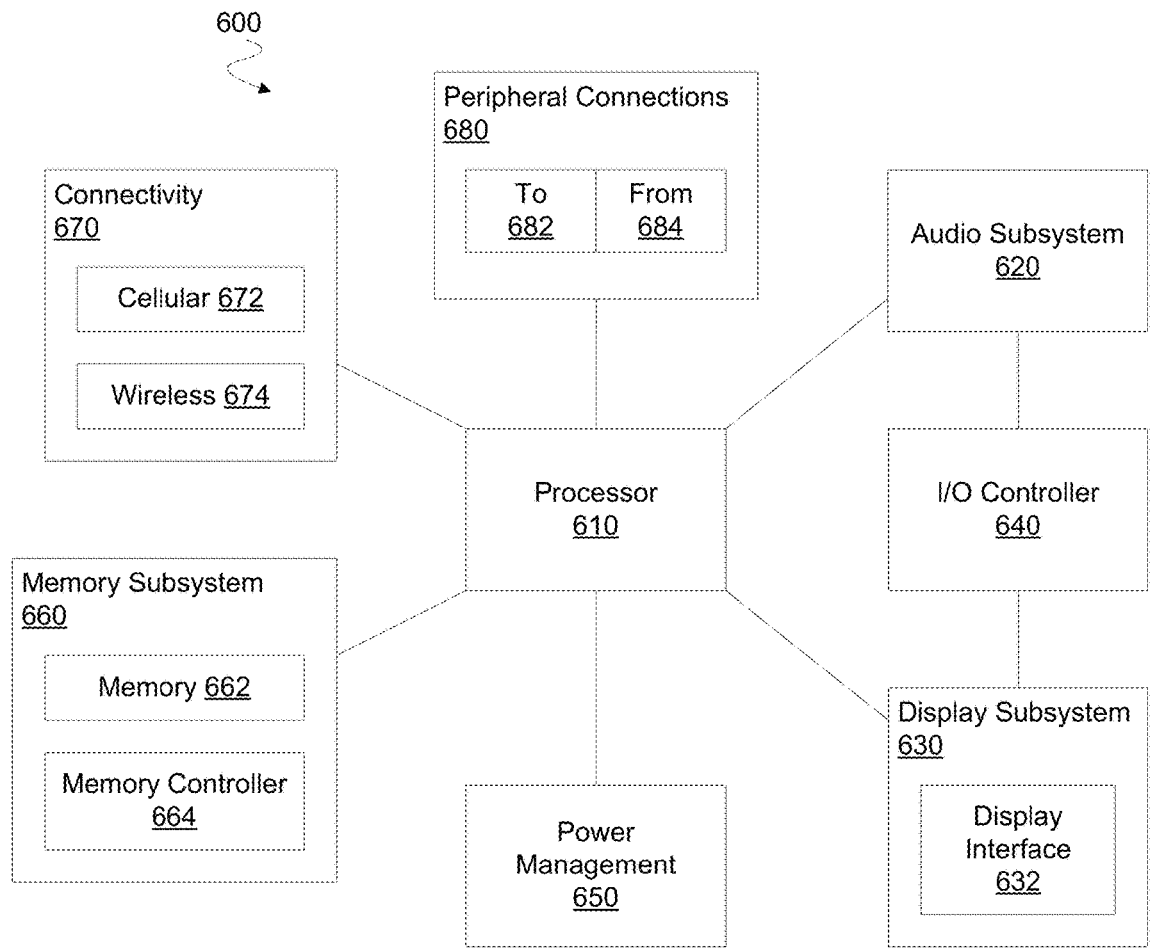
FIG. 6 is a block diagram illustrating elements of a mobile device for providing access to memory resources according to an embodiment.

FIG. 6 is a block diagram of an embodiment of a mobile device in which writes to a memory device may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 may include processor 610, which performs the primary processing operations of device 600. Processor 610 may include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 may include display interface 632, which may include the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 may operate to manage hardware that is part of audio subsystem 620 and/or display subsystem 630. Additionally, I/O controller 640 illustrates a connection point for additional devices that connect to device 600 through which a user might interact with the system. For example, devices that may be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620 and/or display subsystem 630. For example, input through a microphone or other audio device may provide input or commands for one or more applications or functions of device 600. Additionally, audio output may be provided instead of or in addition to display output. In another example, if display subsystem includes a touchscreen, the display device also acts as an input device, which may be at least partially managed by I/O controller 640.

There may also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that may be included in device 600. The input may be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 may include memory device(s) 662 for storing information in device 600. Memory subsystem 660 may include nonvolatile (state does not change if power to the memory device is interrupted) and/or volatile (state is indeterminate if power to the memory device is interrupted) memory devices. Memory 660 may store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 provides commands to operate memory 662. For example, memory controller 664 may issue a command for memory 662 to variously write data to one or more banks of memory cells.

Connectivity 670 may include hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 may include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and may include personal area networks (such as Bluetooth), local area networks (such as WiFi), and/or wide area networks (such as WiMax or LTE), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector may allow device 600 to connect to certain peripherals that allow device 600 to control content output, for example, to audiovisual or other systems.

In addition to a proprietary docking connector or other proprietary connection hardware, device 600 may make peripheral connections 680 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

The disclosed embodiments may be implemented, in some cases, in hardware, firmware, software, or any combination thereof. In one implementation, a memory device comprises input/output (I/O) circuitry to receive signals, a plurality of memory banks, and detector logic comprising circuitry configured to detect for a signal, the signal to specify that received commands include successive write commands each to access a same memory bank of the plurality of memory banks. The memory device further comprises a buffer, wherein, if the detector logic detects the signal, the detector logic to signal the buffer to store first write data of the successive write commands until a receipt of second write data of the successive write commands. The memory device further comprises error correction logic configured to calculate error check information based on the first write data and the second write data.

In an embodiment, if the detector logic detects the signal, the detector logic is further to signal the buffer to store the second write data, concurrently with the first write data, until a receipt of third write data of the successive write commands. In another embodiment, if the detector logic fails to detect the signal, the detector logic is to signal access logic of the memory device to perform a first read-modify-write operation to store the first write data to the plurality of memory banks. In another embodiment, the detector logic to detect for the received signal includes the detector logic to decode an encoded write command address strobe message.

In another embodiment, the memory device further comprises prefetch logic configured to perform a prefetch of bits from one or more memory banks of the plurality of memory banks, wherein a total number of the bits of the prefetch is greater than a total number of bits of the first write data or a total number of bits of the second write data. In another embodiment, the error correction logic to calculate error check information includes the error correction logic to calculate an error check value based on a combination of the first write data and the second write data, wherein access logic of the memory device is to write the error check information and the combination of the first write data and the second write data to the same memory bank of the plurality of memory banks. In another embodiment, the plurality of memory banks includes banks of dynamic random access memories. In another embodiment, an error correction value is based on the first write data and further based on the second write data.

In one implementation, a memory controller comprises an input/output interface to couple the memory controller to a memory device including a plurality of memory banks, and command logic comprising circuitry configured to send commands to the memory device, and send a signal to specify to the memory device that the commands include successive write commands each to access a same memory bank of a plurality of memory banks of the memory device, wherein, in response to the signal, the memory device stores first write data of the successive write commands to a buffer of the memory device until a receipt of second write data of the successive write commands, wherein the memory device further calculates error check information based on the first write data and the second write data.

In an embodiment, based on the signal, the memory device further buffers the second write data, concurrently with the first write data, until a receipt of third write data of the successive write commands. In another embodiment, the command logic to send the signal comprises the command logic to include the signal in an encoded write command address strobe message. In another embodiment, the memory device is configured to perform a prefetch of bits from one or more memory banks of the plurality of memory banks, wherein a total number of the bits of the prefetch is greater than a total number of bits of the first write data or a total number of bits of the second write data.

In one implementation, a method at a memory device comprises receiving commands, detecting for a received signal, the signal to specify that the commands include successive write commands each to access a same memory bank of a plurality of memory banks of the memory device, and if the signal is detected, storing first write data of the successive write commands to a buffer of the memory device until a receipt of second write data of the successive write commands, and calculating error check information based on the first write data and the second write data.

In an embodiment, the method further comprises, if the signal is detected, storing the second write data in the buffer, concurrently with the first write data, until a receipt of third write data of the successive write commands. In another embodiment, the method further comprises, if a failure to detect the signal is indicated, performing a first read-modify-write operation to store the first write data to the plurality of memory banks. In another embodiment, detecting for the signal from the host includes decoding an encoded write command address strobe message. In another embodiment, the method further comprises performing a prefetch of bits from one or more memory banks of the plurality of memory banks, wherein a total number of the bits of the prefetch is greater than a total number of bits of the first write data or a total number of bits of the second write data. In another embodiment, calculating the error check information includes calculating an error check value based on a combination of the first write data and the second write data, the method further comprises writing the error check information and the combination of the first write data and the second write data to the same memory bank of the plurality of memory banks. In another embodiment, the plurality of memory banks includes banks of dynamic random access memories.

In one implementation, a method at a memory controller comprises sending commands from the memory controller to a memory device comprising a plurality of memory banks, and sending a signal to specify to the memory device that the commands include successive write commands each to access a same memory bank of a plurality of memory banks of the memory device, wherein, in response to the signal, the memory device stores first write data of the successive write commands to a buffer of the memory device until a receipt of second write data of the successive write commands, wherein the memory device further calculates error check information based on the first write data and the second write data.

In an embodiment, based on the signal, the memory device further buffers the second write data, concurrently with the first write data, until a receipt of third write data of the successive write commands. In another embodiment, sending the signal comprises including the signal in an encoded write command address strobe message. In another embodiment, the memory device performs a prefetch of bits from one or more memory banks of the plurality of memory banks, wherein a total number of the bits of the prefetch is greater than a total number of bits of the first write data or a total number of bits of the second write data.

In one implementation, a system comprises a memory controller, and a memory device including input/output (I/O) circuitry coupling the memory device to the memory controller, a plurality of memory banks, and detector logic comprising circuitry configured to detect for a signal from the memory controller, the signal to specify that commands from the memory controller include successive write commands each to access a same memory bank of the plurality of memory banks. The memory device further comprises a buffer, wherein, if the detector logic detects the signal, the detector logic to signal the buffer to store first write data of the successive write commands until a receipt of second write data of the successive write commands. The memory device further comprises error correction logic configured to calculate error check information based on the first write data and the second write data. The system further comprises at least one processor, and a network interface, the at least one processor communicatively coupled to the memory controller and the network interface communicatively coupled to the at least one processor.

In an embodiment, if the detector logic detects the signal, the detector logic is further to signal the buffer to store the second write data, concurrently with the first write data, until a receipt of third write data of the successive write commands. In another embodiment, if the detector logic fails to detect the signal, the detector logic is to signal access logic of the memory device to perform a first read-modify-write operation to store the first write data to the plurality of memory banks. In another embodiment, the detector logic to detect for the received signal includes the detector logic to decode an encoded write command address strobe message. In another embodiment, the system further comprises prefetch logic configured to perform a prefetch of bits from one or more memory banks of the plurality of memory banks, wherein a total number of the bits of the prefetch is greater than a total number of bits of the first write data or a total number of bits of the second write data. In another embodiment, the system further comprises one or more of a display communicatively coupled to the at least one processor and a battery coupled to the at least one processor.

Techniques and architectures for performing writes to a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:
1. A memory device comprising:
  input/output (I/O) circuitry to receive signals;
  a plurality of memory banks;
  detector logic comprising circuitry configured to detect
    for a signal, the signal to specify that received com- mands include successive write commands each to access a same memory bank of the plurality of memory banks;
a buffer, wherein, if the detector logic detects the signal, the detector logic to signal the buffer to store first write data of the successive write commands until a receipt of second write data of the successive write commands;
prefetch logic configured to perform a prefetch of bits from one or more memory banks of the plurality of memory banks, wherein a total number of the bits of the prefetch is greater than a total number of bits of the first write data or a total number of bits of the second write data; and
error correction logic configured to calculate error check information based on the first write data and the second write data.

2. The memory device of claim 1, wherein, if the detector logic detects the signal, the detector logic further to signal the buffer to store the second write data, concurrently with the first write data, until a receipt of third write data of the successive write commands.

3. The memory device of claim 1, wherein, if the detector logic fails to detect the signal, the detector logic to signal access logic of the memory device to perform a first read-modify-write operation to store the first write data to the plurality of memory banks.

4. The memory device of claim 1, the detector logic to detect for the received signal includes the detector logic to decode an encoded write command address strobe message.

5. The memory device of claim 1, wherein the error correction logic to calculate error check information includes the error correction logic to calculate an error check value based on a combination of the first write data and the second write data, wherein access logic of the memory device is to write the error check information and the combination of the first write data and the second write data to the same memory bank of the plurality of memory banks.

6. The memory device of claim 1, wherein the plurality of memory banks includes banks of dynamic random access memories.

7. The memory device of claim 1, wherein an error correction value is based on the first write data and further based on the second write data.

8. A memory controller comprising:
an input/output interface to couple the memory controller to a memory device including a plurality of memory banks; and
command logic comprising circuitry configured to:
send commands to the memory device; and
send a signal to specify to the memory device that the commands include successive write commands each to access a same memory bank of a plurality of memory banks of the memory device, wherein, in response to the signal, the memory device stores first write data of the successive write commands to a buffer of the memory device until a receipt of second write data of the successive write commands, wherein the memory device further calculates error check information based on the first write data and the second write data, wherein the memory device is configured to perform a prefetch of bits from one or more memory banks of the plurality of memory banks, wherein a total number of the bits of the prefetch is greater than a total number of bits of the first write data or a total number of bits of the second write data.

9. The memory controller of claim 8, wherein, based on the signal, the memory device further buffers the second write data, concurrently with the first write data, until a receipt of third write data of the successive write commands.

10. A method at a memory device, the method comprising:
receiving commands;
detecting for a received signal, the signal to specify that the commands include successive write commands each to access a same memory bank of a plurality of memory banks of the memory device;
if the signal is detected:
storing first write data of the successive commands to a buffer of the memory device until a receipt of second write data of the successive write commands; and
calculating error check information based on the first write data and the second write data; and
performing a prefetch of bits from one or more memory banks of the plurality of memory banks, wherein a total number of the bits of the prefetch is greater than a total number of bits of the first write data or a total number of bits of the second write data.

11. The method of claim 10, further comprising:
if the signal is detected, storing the second write data in the buffer, concurrently with the first write data, until a receipt of third write data of the successive write commands.

12. The method of claim 10, further comprising:
if a failure to detect the signal is indicated, performing a first read-modify-write operation to store the first write data to the plurality of memory banks.

13. The method of claim 10, wherein calculating the error check information includes calculating an error check value based on a combination of the first write data and the second write data, the method further comprising writing the error check information and the combination of the first write data and the second write data to the same memory bank of the plurality of memory banks.

14. A method at a memory controller, the method comprising:
sending commands from the memory controller to a memory device comprising a plurality of memory banks; and
sending a signal to specify to the memory device that the commands include successive write commands each to access a same memory bank of a plurality of memory banks of the memory device, wherein, in response to the signal, the memory device stores first write data of the successive write commands to a buffer of the memory device until a receipt of second write data of the successive write commands, wherein the memory device further calculates error check information based on the first write data and the second write data, wherein the memory device performs a prefetch of bits from one or more memory banks of the plurality of memory banks, wherein a total number of the bits of the prefetch is greater than a total number of bits of the first write data or a total number of bits of the second write data.

15. The method of claim 14, wherein, based on the signal, the memory device further buffers the second write data, concurrently with the first write data, until a receipt of third write data of the successive write commands.

16. A system comprising:
a memory controller; and
a memory device including:

input/output (I/O) circuitry coupling the memory device to the memory controller;
a plurality of memory banks;
detector logic comprising circuitry configured to detect for a signal from the memory controller, the signal to specify that commands from the memory controller include successive write commands each to access a same memory bank of the plurality of memory banks;
a buffer, wherein, if the detector logic detects the signal, the detector logic to signal the buffer to store first write data of the successive write commands until a receipt of second write data of the successive write commands;
error correction logic configured to calculate error check information based on the first write data and the second write data; and
prefetch logic configured to perform a prefetch of bits from one or more memory banks of the plurality of memory banks, wherein a total number of the bits of the prefetch is greater than a total number of bits of the first write data or a total number of bits of the second write data;

at least one processor; and
a network interface, the at least one processor communicatively coupled to the memory controller and the network interface communicatively coupled to the at least one processor.

17. The system of claim 16, wherein, if the detector logic detects the signal, the detector logic further to signal the buffer to store the second write data, concurrently with the first write data, until a receipt of third write data of the successive write commands.

18. The system of claim 16, wherein, if the detector logic fails to detect the signal, the detector logic to signal access logic of the memory device to perform a first read-modify-write operation to store the first write data to the plurality of memory banks.

19. The system of claim 16, further comprising one or more of: a display communicatively coupled to the at least one processor or a battery coupled to the at least one processor.

* * * * *